United States Patent
Pourrahimi

(10) Patent No.: US 6,510,604 B1
(45) Date of Patent: Jan. 28, 2003

(54) SUPERCONDUCTING CABLES EXPERIENCING REDUCED STRAIN DUE TO BENDING

(75) Inventor: Shahin Pourrahimi, Brookline, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 09/048,732

(22) Filed: Mar. 26, 1998

Related U.S. Application Data

(60) Provisional application No. 60/041,610, filed on Mar. 26, 1997.

(51) Int. Cl.[7] .............................................. H01V 11/00
(52) U.S. Cl. ...................... 29/599; 335/216; 174/125.1; 505/884; 505/887; 505/924
(58) Field of Search ...................... 335/216; 174/125.1; 505/884, 887, 924; 29/599

(56) References Cited

U.S. PATENT DOCUMENTS 4,078,299 A  *  3/1978  Furuto et al. .................. 29/599

OTHER PUBLICATIONS

T. Ando et al., "Experimental Results of the $Nb_3Sn$ Demo Poloidal Coil (DS–EX)", IEEE Transactions on Magnetics, vol. 27, No. 2, pp. 2060–2063, Mar. 1991.

K. DeMoranville et al., "Development of High $J_c$ Bronze Route $Nb_3Sn$ Conductor Using Nb–Ta Composite Filaments", Advances in Cryogenic Engineering, vol. 40, pp. 931–937, 1994 No month.

J.K. Hulm and B.T. Matthias Authors, S. Foner and B.B. Schwartz Editors, "Overview of Materials Development", Superconductor Materials Science: Metallurgy, Fabrication, and Applications (NATO advanced study institutes series, series B, Physics, v. 68), Sec. IV/D,V, IV, pp. 37–61, 1981 No month.

M. Suenaga Author, S. Foner and B.B. Schwartz Editors, "Metallurgy of Continuous Filamentary A15 Superconductors", Superconductor Materials Science: Metallurgy, Fabrication, and Applications (NATO advanced study institutes series, series B, Physics, v. 68), Chap. 4, pp. 201–274, 1981 No month.

E.B. Forsyth et al., "Flexible Superconducting Power Cables", Paper 72 CHO 608 O PWR, IEEE Power Engineering Society, pp. 494–505, May 1972.

(List continued on next page.)

*Primary Examiner*—Ramon M. Barrera
(74) *Attorney, Agent, or Firm*—Wolf, Greenfield & Sacks, P.C.

(57) ABSTRACT

Superconducting cables, wires and methods of making the same are disclosed. The cables can offer improved flexibility while maintaining a high current carrying capacity. Advantageously, the superconducting filaments of the cables can be formed from relatively brittle materials having comparatively high critical temperatures and/or comparatively high critical magnetic fields. Magnet systems can be formed using these cables without using the conventional "react-then-wind" method.

16 Claims, 8 Drawing Sheets

OTHER PUBLICATIONS

B. Jakob et al., "Design and Fabrication of a 17 kA Preprototype $Nb_3Sn$ Conductor for the TF Coils of the Net Fusion Project", IEEE Transactions on Magnetics, vol. 24, No. 2, pp. 1437–1439, Mar. 1988.

F. Jun–ren et al., "The Development of Flexible Superconducting $Nb_3Sn$ Braids and Cables", Journal de Physique, vol. 45, pp. C1/417–420, Jan. 1984.

H. Kasahara et al., "Development of an $Nb_3Sn$ AC Coil with React & Wind Method", IEEE Transactions on Magnetics, vol. 32, No. 4, pp. 2874–2874, Jul. 1996.

M.J. Leupold, "A 42–cm Bore Superconducting Coil Using Pre–Reacted $Nb_3Sn$", IEEE Transactions on Magnetics, vol. 24, No. 2, pp. 1413–1416, Mar. 1988.

S. Pourrahimi and K. DeMoranville, "Development of Composite Flexible $Nb_3Sn$ Cables Suitable for the React–then–wind Approach", IEEE Transaction on Magnetics, vol. 7, No. 2, pp. 815+, Jun. 1997.

* cited by examiner

SUPERCONDUCTING CABLES EXPERIENCING REDUCED STRAIN DUE TO BENDING

RELATED APPLICATION

This non-provisional application claims the benefit under Title 35, U.S.C. §119(e) of co-pending U.S. provisional application serial no. 60/041,610, filed Mar. 26, 1997, entitled "Superconducting Cables Experiencing Reduced Strain Due to Bending" by Shahin Pourrahimi, incorporated herein by reference.

BACKGROUND

1. Field of the Invention

The present invention relates generally to superconducting cables experiencing reduced strain, and more specifically to such superconducting cables that are composed of A-15 materials.

2. Discussion of the Related Art

Superconductors are phases that exhibit extremely low (practically zero) electrical resistance below their critical temperature and critical magnetic field. Superconducting cables have been used in a variety of applications, predominantly in superconducting electromagnetic magnets in which a superconductor is wound into a coil. Superconducting magnets have been used in applications including, for example, devices used for nuclear magnetic resonance (NMR) spectroscopy, magnetic resonance imaging (MRI), superconducting magnetic energy storage (SMES) and magnetic mine sweeping, as disclosed in, for example, *Superconducting Magnets,* M. N. Wilson, Oxford University Press, New York, N.Y. (1983) (hereinafter "Wilson") and *Case Studies in Superconducting Magnets,* Y. Iwasa, Plenum Press, New York, N.Y. (1994) (hereinafter "Iwasa").

To wind a coil, of course, the material defining the coil must be bent. The smaller the coil, the more the material defining the coil must be bent. Since superconducting magnets in many cases are made of a relatively small coil, the superconducting material defining the coil must be bent significantly. Even in the case of relatively large coils, bending superconductors to make coils according to prior art methods can be problematic due to the relatively large cross-sectional size of the superconductors typically used in these applications. One reason that superconducting magnets might desirably be small is in NMR applications where the intensity of the magnetic field is critical. Stored energy of the magnet system and its overall cost scale directly with the size of the bore of the superconducting magnet where intense magnetic fields are produced. In general, for two superconducting magnet systems designed and fabricated to produce a given magnetic field strength, the system with a smaller superconducting magnet bore will be less costly to fabricate and operate. In order to wind a superconductor around a magnet bore, the superconductor must be bent significantly. The lower limit on the radius of curvature to which a superconductor, such as in a superconducting cable, can be wound within a magnet system, such as an NMR, MRI, or other practical magnet systems, is usually determined by the irreversible strain (defined below) of the superconductor.

Superconducting wires are typically comprised of a plurality of superconducting filaments disposed within a matrix that is typically formed of an electrically conducting material, such as metals and metal alloys. Typically, superconducting cables are formed of a plurality of intertwined wires including superconducting wires. Superconducting cables are often used for large current applications and may include additional wires that are not superconducting in order to provide physical support to the cable and/or to act as a current stabilizing medium should superconductivity of any of the superconducting wires be interrupted.

When a superconductor or superconducting cable is bent, strain is induced on the superconducting filaments. Since many superconductors are brittle, bending them can cause them to break. That is, in winding superconducting coils, if the strain surpasses the irreversible strain of the material from which the superconducting filaments of the cable are formed, the potential magnetic field of the system can not be achieved. Hence, for a given superconductor or superconducting cable, there is a lower limit on the radius of curvature to which the superconductor or superconducting cable can be wound within the magnet system, dependant on the irreversible strain of the superconducting filaments within the superconductor or superconducting cable.

Known superconductors must be cooled to be made superconducting and must be kept cool to remain superconducting, for example, in a bath of liquid helium. The intensity of the magnetic field produced by a superconducting magnetic generally scales with the number of turns of the superconductor or superconducting cable present. Generally, a superconductor, such as superconducting wire or cable, is wound around a support structure or coil form a number of times in order to produce a desired magnetic field. In order to eliminate undesirable electrical current flow between the windings and/or turns, superconductors are advantageously electrically insulated. In conventional systems involving brittle superconductors, electrical insulation of the superconductors, such as superconducting wires or cables, is typically performed after the superconductor is wound around the support or coil form. This method is limited in its efficiency because it cannot always optimize the ratio of conductor to non-conductor present in the windings.

A15 superconductors are known intermetallic compounds (defined below) that have relatively high critical temperatures and critical magnetic fields compared to other conventional superconducting alloys, so it is desirable to employ A15 superconductors in many magnet systems, particularly such systems that are designed for use with magnetic fields of above 10 Tesla, typically from about ten to about 24 Tesla. While A15 superconductors can provide certain superior performance characteristics, these are inherently brittle and have relatively low irreversible strains. Therefore, monolithic A15 superconductors (those which comprise a continuous medium or whose members are bonded together) typically cannot be wound to a small enough radius of curvature to be useful for winding into coils in fabricating many magnet systems. In an attempt to overcome this problem, a "wind-then-react" (or "wind-and-react") method has been commonly used to incorporate A15 superconductors into magnet systems. As described in Wilson and Iwasa, the "wind-then-react" method involves winding unreacted cables around a support or coil form and subsequently heating the entire magnet system to cause a reaction within the unreacted cables to form superconducting filaments (filaments comprising a superconducting phase) within the cables. However, this approach has several disadvantages in many cases. For example, since heating occurs after the cable is wound within the magnet system, the various components of the magnet system should be compatible with the temperatures used during the formation of the superconducting phase (e.g., about 925 K for $Nb_3Sn$). This can severely limit the choice of materials from which various components of the magnet system can be formed. For example, the magnet system often cannot include aluminum or its alloys since these melt at the temperatures used during formation of the superconducting filaments. Another important disadvantage is the difficulty and expense of applying insulation to a magnet winding to effectively coat the individual conducting wires or cables to prevent electrical current flow between the windings/turns. Hence, the "wind-then-react" method can result in higher cost and complexity in preparing the magnet system, while resulting in a system that may offer inferior performance.

An alternative to the "wind-then-react" method is the "react-then-wind" technique. As discussed in Wilson and Iwasa, the "react-then-wind" method involves forming the superconducting filaments within superconducting cables by heat reacting and subsequently winding the cables into the magnet system. Since heating of the cables occurs prior to their incorporation into the magnet system, the "react-then-wind" method allows for a broader range of materials from which the components of the magnet system can be formed. However, the low irreversible strain of many superconductors has precluded the broad use of the "react-then-wind" method or systems with small bores with these superconductors. Instead, the "react-then-wind" method has typically been confined to systems such as superconductors having tape-like cross-sections (where the typical ratio of width to thickness is larger than 10). M. J. Leupold *Cryogenics* 24, 1413–1417 (1988) (hereinafter "Leupold") and B. Jakob et al., *IEEE Trans. on Magn.* 24, 1437–1439 (1988) (hereinafter "Jakob") disclose typical tape-like A15 superconductors appropriate for use with the "react-then-wind" method. Despite their ability to be incorporated into magnet systems using the "react-then-wind" method, magnet systems having tape-like superconductors have several disadvantages relative to A15 superconducting cables. For example, tape-like A15 superconductors are typically monolithic and are design/application specific, and systems employing these superconductors can not be readily scaled to allow for changes in current-carrying capacity.

While the above and other documents describe, in many cases, useful superconducting arrangments, including high temperature superconductors, there exists a for, and applications of, improved superconductors, including superconducting cables and systems incorporating brittle superconductors, appropriate for use in many of the common applications for superconductors, such as in superconducting magnet systems. It is an object of the invention to provide improved superconducting cables, magnet systems, and methods for their production and use.

SUMMARY

In one embodiment, the present invention provides a cable which comprises a plurality of wires. At least one of the wires, alternatively a plurality of the wires, has at least one filament formed of a brittle superconductor. The wires are intertwined to define intimate contact surface areas at least 50% of which are free of inter-wire bonds.

In another embodiment, the present invention provides a cable which comprises a plurality of wires. At least one of the wires has at least one filament formed of a brittle superconductor. The wires are intertwined so that a strain on at least one filament due to bending of the cable is essentially independent of a cross-sectional radius of the cable.

In yet another embodiment, the present invention provides a superconducting cable which comprises a plurality of wires with at least one of the wires having at least one filament formed of a brittle superconductor. At least one of the superconducting wires having at least one filament formed of a brittle superconductor undergoes a degradation in critical current density of at least about 10% beyond an axial strain of about 2% and has a cross-sectional dimension of at most about 0.5 millimeter.

In a still another embodiment, the present invention provides a method of making a magnet system. The method comprises the steps of providing a cable and forming the cable into a coil. The cable is formed of a plurality of intertwined wires. At least one of the wires is a superconducting wire having at least one filament formed of a brittle superconductor. At least one superconducting wire having at least one filament formed of a brittle superconductor undergoes a degradation in critical current density of at least 10% beyond an axial strain of about 2%. When formed into a coil of minimum radius of curvature less than about 0.25 meter, the cable retains a cable critical current density of at least about 90%.

In a another embodiment, the present invention provides a method of making a magnet system. The method comprises the steps of providing a cable and forming the cable into a coil. The cable is formed of a plurality of intertwined wires. At least one of the wires is a superconducting wire having at least one filament formed of a brittle superconductor. At least one superconducting wire having at least one filament formed of a brittle superconductor undergoes a degradation in critical current density of at least 10% beyond an axial strain of about 2% and has a maximum cross-sectional dimension of about 0.5 millimeter.

In a further embodiment, the present invention provides a method of making a magnet system. The method includes the steps of providing a cable and forming the cable into a coil. The cable is formed of a plurality of intertwined wires. At least one wire has at least one filament formed of a brittle superconductor. The intertwined wires define intimate contact surface areas at least 50% of which are free of inter-wire bonds.

In yet a further embodiment, the present invention provides a method of making a magnet system. The method includes the steps of providing a cable and forming the cable into a coil. The cable is formed of a plurality of wires. At least one of the wires has at least one filament formed of a brittle superconductor. The wires are intertwined so that the strain experienced by at least one filament due to bending of the cable is essentially independent of a cross-sectional radius of the cable.

In another aspect, the present invention provides a method for making a magnet system that is able to produce a magnetic field of at least 10 Tesla. The method involves winding a cable around a support structure having a minimum radius of curvature less than about 0.25 m. The cable is formed of a plurality of wires at least one of which has at least one filament formed of a brittle superconductor.

In still a further embodiment, the present invention provides a magnet system which comprises a cable wound around a support structure. The cable is formed of a plurality of wires. At least one of the wires has at least one filament formed of a brittle superconductor. The wires are intertwined so that a strain on at least one filament due to bending of the cable is essentially independent of a cross-sectional radius of the cable.

In another embodiment, the present invention provides a magnet system which comprises a cable wound around a support structure. The cable is formed of a plurality of wires.

At least one wire has at least one filament formed of a brittle superconductor. The wires are intertwined to define intimate contact surface areas at least 50% of which are free of inter-wire bonds.

Also provided by the invention are methods for producing a superconducting cable. In one aspect, the invention involves a method of making a superconducting cable. The method comprises intertwining a plurality of wires, at least one of which contains at least one superconducting filament, so that more than 50% of the intimate contact surface areas are free of inter-wire bonds. In another embodiment, the method comprises intertwining a plurality of wires and subsequently reacting the wires to form at least one brittle, superconducting filament while leaving more than 50% of the intimate contact surface areas free of inter-wire bonds.

In yet another aspect, the invention provides a method of making a superconducting cable from a plurality of wires, at least one of which contains at least one filament formed from a brittle superconductor. The method involves intertwining the wires to form a cable so that the strain on the wires within the cable due to bending of the cable is essentially independent of a cable cross-sectional radius. In another embodiment, the method comprises intertwining a plurality of wires to form a cable and subsequently reacting the wires to form at least one brittle, superconducting filament so that the strain on the wires within the cable is essentially independent of a cable cross-sectional radius.

In another embodiment, the invention provides a method of fabricating a superconducting cable by intertwining a plurality of wires with at least one wire having at least one filament formed of a brittle superconductor. At least one of the superconducting wires having at least one filament formed of a brittle superconductor undergoes a degradation in critical current density of at least 10% beyond an axial strain of about 2% and has a maximum cross-sectional dimension of 0.5 mm. In another embodiment, the method comprises intertwining a plurality of wires to form a cable and subsequently reacting the wires to form at least one brittle, superconducting filament, where at least one wire having at least one filament formed of a brittle superconductor undergoes a degradation in critical current density of at least 10% beyond an axial strain of about 2% and has a maximum cross-sectional dimension of about 0.5 mm.

Other advantages, novel features, and objects of the invention will become apparent from the following detailed description of the invention when considered in conjunction with the accompanying drawings, which are schematic and which are not intended to be drawn to scale. In the figures, each identical or nearly identical component that is illustrated in various figures is represented by a single numeral. For purposes of clarity, not every component is labeled in every figure.

DETAILED DESCRIPTION

Figure 1:
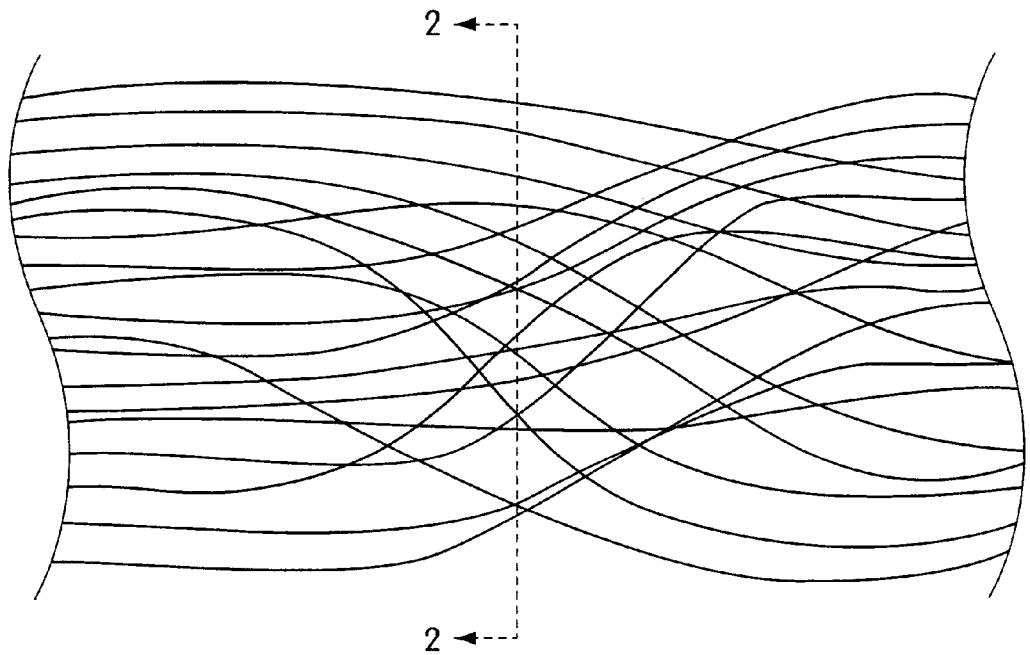
FIG. 1 is a perspective view of a superconducting cable according to the related art.

The present invention provides a number of flexible superconducting articles. Also provided are a number of methods of producing flexible superconducting cables, some methods involving winding a cable into a coil to define a superconducting magnet.

Certain terminology associated with the description of the present invention now will be defined. As used herein, the term "superconductor" refers to a Type II superconductor as defined in J. K. Hulm and B. T. Matthias, *Superconductor Material Science*, edited by S. Foner and B. B. Schwartz, Plenum Press, New York, N.Y., 1981, pp.37–53 (hereinafter "Hulm"). The "critical magnetic field" of a compound herein denotes the maximum magnetic field to which the compound can be exposed while remaining a superconductor, and the "critical temperature" of a compound herein refers to the maximum temperature below which the compound can remain a superconductor. "Critical current density" means the maximum current density achievable at a given temperature below the critical temperature and in the presence of a given background magnetic field lower than the critical magnetic field.

The "irreversible strain" ($e_{ir}$) of a superconductor herein denotes the tensile strain at which appreciable, irreversible degradation of critical current density occurs. When a wire is bent, the portion of the wire exterior of the central neutral axis is strained. In practical applications, therefore, the irreversible strain is a limiting factor defining the ratio of a cross-sectional radius of bonded cable or monolithic conductor to the minimum radius of curvature to which the conductor can be bent without reaching irreversible degradation of critical current density.

In making brittle superconductor wires of A15 compounds, typically a first reactant (for example filaments) is provided in a matrix that defines or contains a second reactant. The two reactants are reacted (usually by heating) and the filaments become reacted superconducting phases (see Hulm). For brittle superconducting material, one complication is that once the superconductor is made, it can not be deformed significantly, and therefore winding of the superconductor is a problem. For example, in one illustrative A15 material, Niobium is reacted in a bronze (Cu—Sn) matrix to produce $Nb_3Sn$. Once filaments of $Nb_3Sn$ are formed, bending the superconductor is problematic since the irreversible strain is limited to relatively low values, e.g. less than 1% (this is an example of brittle filaments). Two accepted methods of making coiled brittle superconductors is either to produce the winding or coil of the reactants, then reacting the material to form the superconductor in a wound state ("wind-then-react"), or to produce the winding from the reacted superconductor without reaching irreversible strain ("react-then-wind"). One problem with the latter approach is that the size of the winding radius is limited to above a threshold value determined by the irreversible strain due to bending ($e_{ir} \approx$ a characteristic superconductor radius/ winding radius). In prior art superconducting cable configurations the strain on the superconducting filaments due to bending and the minimum winding radius is assumed to scale with the cross-sectional radius of the entire cable so that the appropriate characteristic superconductor radius above is the cable radius; however, with cables provided by the present invention, the strain on the superconducting filaments due to bending and the minimum winding radius instead scales with a characteristic superconductor radius defined by the cross-sectional radius of the wires comprising the cable and, therefore, the strain on the superconducting filaments due to bending and the minimum winding radius is essentially independent of the overall cable radius over a wide range of cable length and winding radii of practical interest. One problem with the wind-then-react approach is that heat treatment of large windings can be complicated due to the possible high-temperature incompatibility of materials used in the coil (such as structural vs. superconductor) and thermal-mechanical behavior upon cooling to cryogenic temperatures.

Figure 2:
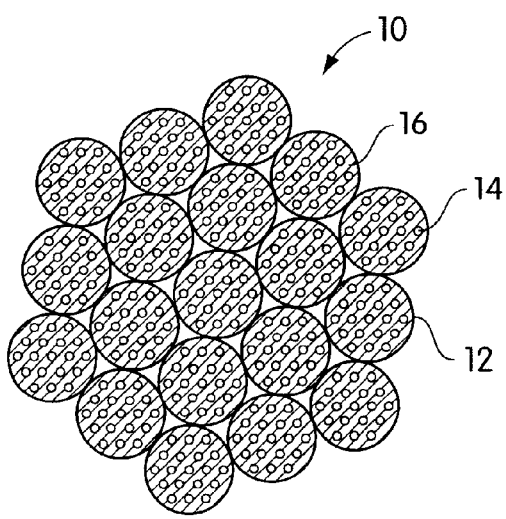
FIG. 2 is a cross-sectional view of the superconducting cable of FIG. 1 taken along line 2—2.
Figure 3:
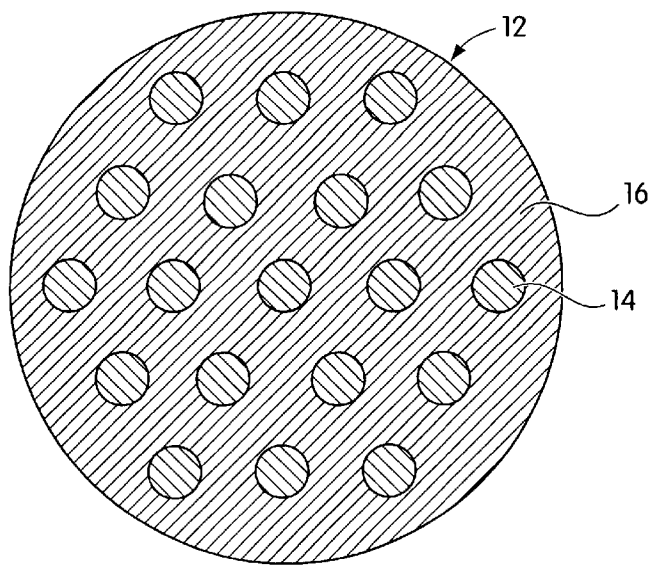
FIG. 3 is a cross-sectional view of a wire within the superconducting cable of FIGS. 1 and 2.
Figure 4:
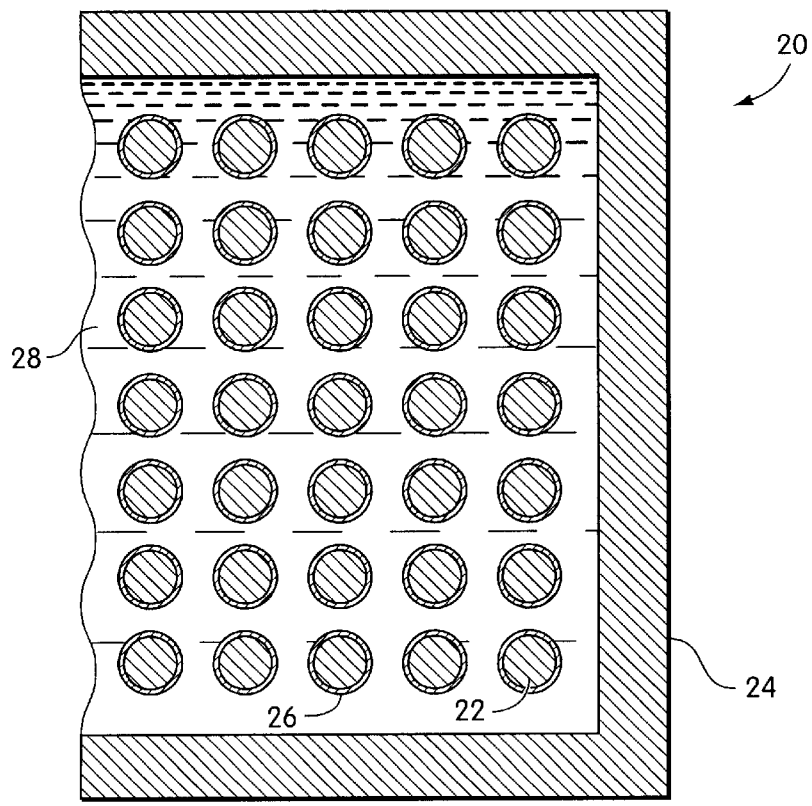
FIG. 4 is a bath cooled superconducting magnet system according to the related art.
Figure 5:
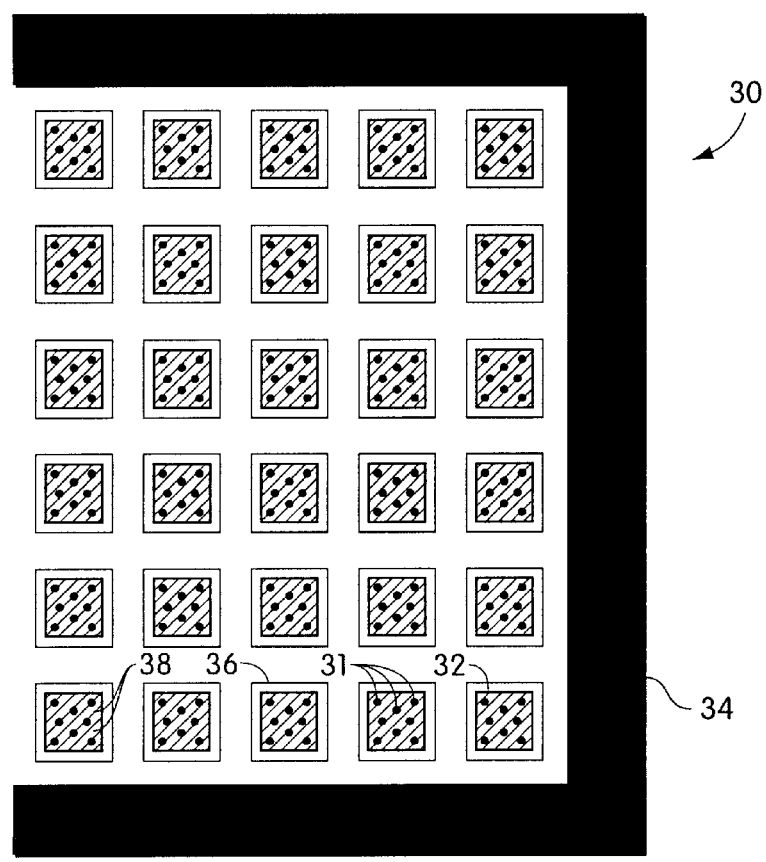
FIG. 5 is a forced flow superconducting magnet system according to the related art.

FIGS. 1 and 2 show a typical superconducting cable 10 having a plurality of intertwined wires 12. FIG. 3 shows that each wire 12 is formed of a plurality of filaments 14 disposed within a matrix 16. Each filament 14 is formed of a superconductor, while matrix 16 is typically formed of an electrically conductive material, such as copper, silver, aluminum and their alloys. With this arrangement, the overall current carrying capacity of cable 10 is relatively large since it is the sum of the current carrying capacity of each wire 12. Because each filament 14 carries only a fraction of the current through cable 10, the loss of current carrying capacity due to the fracture of a given wire 12 or filament 14 is comparatively small, increasing the stability of cable 10. Known superconductors must be cooled to be made superconducting and kept cool to remain superconducting. FIG. 4 shows a conventional bath cooled superconducting magnet system 20. Such magnetic systems are discussed in Wilson and Iwasa. To increase the magnetic field formed by system 20, each superconductor 22 is wound around a support structure or coil form 24 a number of times. Furthermore, since the size of this magnetic field system generally scales with the number of turns of the superconducting cable present, system 20 includes numerous turns of cable wound around structure 24. To eliminate electrical flow between the windings and/or turns, the superconducting cable 22 is surrounded by a coating of an electrically insulating material 26. Material 26 is covered with an adhesive material, such as an epoxy, to hold the cable 22 in place within system 20. A bath of cryogenic fluid 28, such as liquid helium, is in thermal communication with the windings of the cable 22 to maintain system 20 below the critical temperature of the superconducting filaments within cable 22. FIG. 5 shows an alternate superconducting magnet system 30, commonly referred to as a forced flow cooling system. Forced flow systems are disclosed in, for example, Wilson and Iwasa. System 30 includes many turns of cable 32 wound within a conduit to a magnet geometry around a support structure or coil form 34. In addition, system 30 includes a conduit 36 surrounding the coiled cable 32. This allows superconducting filaments 31 to be cooled below their critical temperature by the flow of cryogenic fluid through voids 38.

The present invention provides methods involving first reacting to form a superconducting material, then accommodating winding the material into a coil geometry, by providing cables with low inter-wire bonding. As used hereafter, the term "bonded superconducting cable" refers to a superconducting cable in which bonds (defined below) exist between the wires of the cable (inter-wire bonds) such that irreversible strain is determined by the ratio of the overall cable radius to the minimum winding radius, and the phrase "non-bonded superconducting cable" refers to a superconducting cable in which the wires are essentially free of bonds between them to the extent that smaller winding radii can be achieved as compared to bonded cables. In the present invention, non-bonded cables are provided in which at least 50% of intimate contact surface areas (exterior surfaces of wires in intimate contact with other wires) are free of bonds with other wires. For example, two wires that are twisted in a cable so as to be in intimate contact along the direction of the cable will have less than 50% of their contacting surfaces in a bonded state. That is, at least 50% of the contacting surfaces of the wires are free of inter-wire bonds. In a preferred embodiment, non-bonded cables are provided in which at least 60% of intimate contact surface areas are free of bonds with other wires, in a more preferred embodiment at least 70% of intimate contact surface areas are free of bonds, in a more preferred embodiment at least 80% of intimate contact surface areas are free of bonds, and in a still more preferred embodiment at least 90% of intimate contact surface areas are free of bonds . The degree of bonding between the wires can be altered to tailor the flexibility of the cable made of the wires. Maximum flexibility is achieved in a cable of 100% bond-free wires. The ultimate flexibility is determined by the degree to which the wires of the cable are free of bonding to each other. "Bonds", as used in this context, means chemical bonds, crystal lattice-type bonds (generally considered ionic), metallic bonds, mechanical bonds (e.g. interlocking; friction) and other bonds of significant strength that would prevent wires in intimate contact from slipping relative to each other.

As mentioned previously, for a bonded superconducting cable, the maximum allowable strain is proportional to the ratio of the cross-sectional radius of the overall cable to the minimum radius of curvature to which the cable can be bent without irreversible strain. For a nonbonded superconducting cable, the maximum allowable strain scales with the ratio of the cross-sectional radius of the largest brittle wire within the cable to the minimum radius of curvature to which the cable can be bent without irreversible strain. Therefore, a non-bonded superconducting cable of the invention can be bent to a much smaller radius of curvature than a bonded superconducting cable.

One known technique for winding superconducting material of relatively large cross-section around relatively small radii is to use a superconductor having a tape-like cross-section. As used herein, a "superconductor having a tape-like cross-section" refers to a superconductor having a cross-sectional width to cross-sectional height ratio (aspect ratio) of at least about ten. The present invention allows for use of superconductors that are not tape-like in cross section, in particular, cables having an aspect ratio of less than 10:1, preferably less than about 6:1, more preferably less than about 4:1, more preferably less than about 2:1, more preferably less than about 1.5:1, and more preferably still about 1:1. "Aspect ratio" means, in this context, the ratio of the largest cross-sectional dimension to the smallest similar cross-sectional dimension. The cables typically are preferably cylindrical in overall shape, more preferably they are nearly circular cylinders, and the aspect ratio is the largest cross-sectional dimension to the smallest cross-sectional dimension, or, in other preferred embodiments, the cables are rectangular, approaching square, and the aspect ratio is the largest corner-to-cross-sectional dimension to the smallest corner-to-corner cross-sectional dimension or largest side-to-side cross-sectional dimension to smallest side-to-side cross-sectional dimension, whichever is greater. For some embodiments involving rectangular cables, the corners are preferably rounded in contour.

The methods and articles of the invention each involve a relatively brittle superconducting material that is arranged in a cable that has unusual flexibility. This flexibility is due to the fact that the superconducting material is provided as filaments in superconducting wires that are fabricated to make a cable in such a way that the wires are to some extent free of bonds to each other. This allows for slippage between wires that in turn allows for winding of the cables at radii significantly smaller than those achievable prior art superconductors using these materials. For example, the methods and articles of the invention enable the construction of superconducting magnets including superconducting cable that is wound into coils of small radii of curvature. The flexible superconducting cables provided by the invention may, for example, be advantageously wound into a coil with a minimum radius of curvature about an order of magnitude or more less than that which can be effectively fabricated from a monolithic superconductor or prior art superconducting cable. "Radius of curvature" as used herein refers to the minimum radius of curvature of any point in the coil winding. For example, for a cable wound on a support in the shape of a circular cylinder, the radius of curvature as referred to herein would be measured from the center of the bore to the closest inside surface of the cable to the center of the bore. For more complex coil shapes, for example a rectangular shape with rounded corners, the minimum radius of curvature would be the radius of curvature of the rounded corners as measured from the center of curvature to the closest inside surface of the cable to the center of curvature. The radius of curvature of a support structure upon which a coil is wound refers to the minimum radius of curvature of a surface of the structure upon which the coil is wound. In particular, superconducting magnet systems can be fabricated from cable provided by the present invention that have a coil with a minimum radius of curvature of 0.25 m or less.

The invention allows the use of relatively brittle superconducting materials for fabricating coils. In particular, the invention involves superconducting cables made up of at least some wires that include brittle filaments made of superconducting material that can tolerate an axial strain of no more than of about 2% without at least 10% degradation of critical current density ($J_c$), and in which measurable degradation of critical current density exists beyond an axial strain of about 1% or less. Those of ordinary skill in the art will recognize superconducting materials that fall within this definition. According to one embodiment, this set of brittle superconductors is defined by a "line compound", that is, material made of at least two different elements that exist in combination in an essentially crystalline arrangement in which the at least two elements have a distinct chemical formula, typically dictated by the particular crystal arrangement of the materials. In particular, a line compound is a compound of two or more elements that exist together in a ratio reflecting the normal positioning of the component atoms in the crystal structure of the compound. On a phase diagram, line compounds often appear as an intermediate phase that exists over a comparatively narrow range of compositions. Ceramics and intermetallics are examples of line compounds.

A "ceramic" herein denotes a line compound that is formed of metal atoms and/or nonmetal atoms such as oxygen. For example, certain oxides are ceramics. Particularly preferred ceramics include high temperature superconducting compounds. These compounds are defined by ceramics having Perovskites layered structures and with critical temperatures above 40 K. Such high temperature superconducting materials are well known to those skilled in the art.

"Intermetallic compound" herein refers to a line compound of at least two metals that has a distinct chemical formula. An intermetallic compound can be a compound of two or more metals that exist together in a ratio reflecting the normal positioning of the component atoms in the crystal structure of the compound. On a phase diagram, intermetallic compounds often appear as an intermediate phase that exists over a comparatively narrow range of compositions.

A15 superconductors are particularly preferred superconducting materials for use as filaments within at least some wires defining cables of the present invention. An "A15 superconductor" herein denotes an intermetallic compound having a critical temperature below about 40 K. In addition to the intermetallic compound, A15 superconductors can also include various other materials or additives known to one of skill in the art in order to impart or improve desirable properties of the superconductor. Accordingly, hereinafter, specific A15 superconductors including an intermetallic compound, and, potentially, supplemental materials, will be denoted as "intermetallic-based compounds." An illustrative and nonlimiting list of A15 superconductors includes $Nb_3Sn$-, $Nb_3Al$-, and $V_3Ga$-based compounds. These and other A15 superconductors and techniques for fabricating superconducting filaments within a matrix are disclosed in, for example, Hulm. M. Suenaga, *Superconductor Material Science*, edited by S. Foner and B. B. Schwartz, Plenum Press, New York, N.Y., 1981, pp. 201–266 (hereinafter "Suenaga") incorporated herein by reference. Suenaga discloses, for example, a typical A15 superconducting wire which includes one or more $Nb_3Sn$-based filaments disposed within a bronze matrix. The matrix material can be any suitable carrier which will form the intermetallic compound desired upon reaction. Suitable matrix materials are well known in the art and are discussed in more detail in Suenaga.

Figure 6:
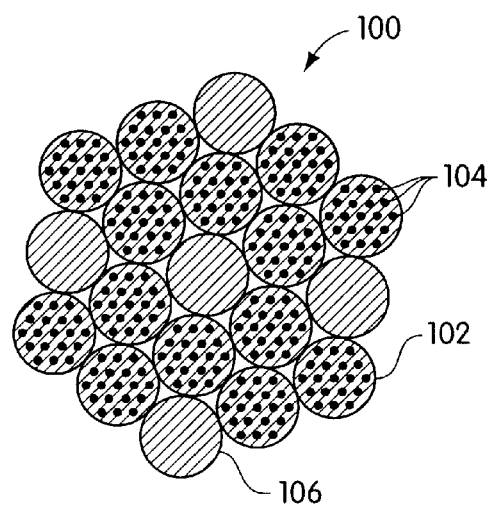
FIG. 6 is a superconducting cable according to one embodiment of the present invention.

In one aspect, the present invention relates to a nonbonded superconducting cable 100 as shown in FIG. 6. Cable 100 includes one or more intertwined wires 102 each composed in part of superconducting filaments 104 such that each of the wires 102 shows a measurable degradation in current density beyond an axial strain on the order of 1% and a degradation in critical current density of at least 10% beyond an axial strain of about 2%. The cable 100 can also include wires 106 that do not include superconducting filaments. Such non-superconducting wires can be used to provide mechanical support or current stabilization and are typically composed of a material, such as a metal or metal alloy. Most of the wires 102 and 106, for example at least 80% of the wires, are transposed meaning that each wire will occupy each one of the different geometric positions within the cable structure at some point along the length of the cable. Because of this, when wound in a coil, the average strain on all equally-sized wires in the cable can be nearly equal. Preferably, all of the wires are transposed. In a preferred embodiment, the cable 100 would include wires 102 that show a measurable degradation in current density beyond an axial strain of about 0.5% and a degradation in critical current density of at least 10% beyond an axial strain of about 1%, or more preferably a degradation in critical current density of at least 15% beyond an axial strain of about 1%, and even more preferably a degradation in critical current density of at least 20% beyond an axial strain of about 1%, and most preferably a degradation in critical current density of at least 50% beyond an axial strain of about 1%. For example, wires 102 could include superconducting filaments 104 comprised of an A15 superconductor.

The current-carrying capacity of a wire within a superconducting cable decreases as the cross-sectional radius of the wire decreases. For example, in a wire formed of $Nb_3Sn$ disposed within a bronze matrix with about 50% of the cross-section being bronze, the current carrying capacity of the wire drops from about 300 Amps to about 3 Amps, at 4.2 K and 5 Tesla, as the diameter of the wire is decreased from about 1 millimeter to about 0.1 millimeter. Wires with such low current-carrying capacity are not useful for fabrication of practical magnet systems because large numbers of coil turns are required to produce typically desirable magnetic field strengths. A large number of coil turns in turn entails a relatively large inductance for the system, which produces undesirable/detrimental voltages when the superconducting magnet quenches (i.e. undergoes a transition from a superconducting to a non-superconducting state). Furthermore, in prior art arrangements involving a wind-then-react method of coil fabrication, small diameter wires can lead to a relatively low packing factor of wires or cable in a coil, which entails a reduction in the magnetic field produced by the coil when compared to a higher packing factor. In addition, the cost of preparing a wire can in some cases increase as the cross-sectional diameter of the wire decreases. Therefore, conventional superconducting wires typically have a diameter of at least about 0.5 millimeter.

Contrary to typical prior art arrangements using wires having comparatively large cross-sectional diameters, the present invention provides superconducting cables with high current capacity that are formed from wires with relatively small cross-sectional diameters. Preferably, wires 102 have a cross-sectional radius of at most about 0.5 millimeter, more preferably wires 102 have a cross-sectional radius of at most about 0.2 millimeter and most preferably wires 102 have a cross-sectional radius of from about 0.1 millimeter to about 0.2 millimeter.

In certain embodiments, the cross-sectional diameter of every wire 102 may not be the same. For these embodiments, preferably at least 70% of wires 102 have a cross-sectional diameter less than about 0.5 millimeter, or other preferred dimensions noted above, more preferably at least about 80% of wires 102 have a cross-sectional diameter less than about 0.5 millimeter, or other preferred dimensions noted above, and most preferably at least about 90% of wires 102 have a cross-sectional diameter less than about 0.5 millimeter, or other preferred dimensions noted above.

To have a sufficient current-carrying capacity to be used in most practical superconducting magnet systems, cable 100 should include enough wires 102 and 106 such that the cable has a cross-sectional area of at least about 1 square millimeter. Preferably, cable 100 has a cross-sectional area of at least about 10 square millimeters, more preferably at least 1 square centimeter, more preferably at least 10 square centimeters.

To be used within most practical superconducting magnet systems, cable 100 should have a current carrying capacity of at least about 100 Amps. Preferably, cable 100 has a current carrying capacity of at least about 500 Amps, more preferably at least about 10,000 Amps, more preferably at least about 50,000 Amps, and most preferably at least about 100,000 Amps for a given magnetic field and operating temperature.

A particularly preferred set of embodiments includes combinations of preferred parameters noted above. For example, one preferred embodiment, cable 100 has a current carrying capacity of at least about 100 amps and at least about 70% of wires 102 have a cross-sectional diameter of from about 0.1 millimeter to about 0.5 millimeter. In another preferred embodiment, cable 100 has a current carrying capacity of at least about 500 amps and at least about 70% of wires 102 have a cross-sectional radius of from about 0.1 millimeter to about 0.5 millimeter. In one particularly preferred embodiment, cable 100 has a current carrying capacity of at least about 10,000 amps and at least about 70% of wires 102 have a cross-sectional radius of from about 0.1 millimeter to about 0.5 millimeter.

The thermo-electrical stability of a superconducting wire increases as the surface-to-volume ratio of the cable increases. However, as discussed above, when compared to cables provided by the present invention most prior art superconducting cables are fabricated with comparatively large cross-sectional diameter wires to reduce overall fabrication costs of systems including cables having a desired current-carrying capacity. Thus, these cables have inferior cryogenic stabilization. In contrast, due to the relatively small cross-sectional diameter of the wires within the superconducting cable of the present invention, the wires have superior cryogenic stabilization.

In preferred embodiments of the present invention, superconducting cables are provided that are formed from wires with a relatively low degree of inter-wire bonding. Because of this design, the strain induced within the filaments of the superconducting cable scales with the diameter of the superconducting wire strands comprising the cable and not with the overall cable diameter. As a result, the cable can be wound to a comparatively small radius of curvature before inducing a strain detrimental to the superconducting performance (past the irreversible strain of the superconductor). In contrast, in typical conventional bonded superconducting cables the strain induced within the filaments scales with the radius of the cable. Hence, for a given compound used for the filaments of a superconducting cable, the present invention provides a cable that has higher flexibility.

Due to their increased flexibility, the superconducting cables of the present invention can accommodate fabrication of brittle-type superconducting magnets by the preferred "react-then-wind" method. Thus, the superconducting cable can be prepared and subsequently wound into a coil, for example by disposing the cable in a coil form, or coiled conduit, or by coiling a conduit containing the cable. Also, because of the flexibility of the cable, the reacted superconducting cable according to the present invention may be wound into coils with comparatively small radii of curvature, for example, less than 0.25 meter. Furthermore, since reacting the cable prior to winding removes any requirement for the coil-form material (that is, structural material such as a conduit or mandrel associated with formation of a coil) to be compatible with the reaction temperature of the superconductor, the coil-form material and other components involved in the magnet system can be selected based solely on thermal compatibility with the superconductor between room temperature and the operating temperature of the magnet system This is to be contrasted with typical related art systems in which the unreacted cable is first placed within the conduit and/or coil form then reacted. In these systems, metal support materials should be thermally compatible with the superconductor between the reaction temperature of the superconductor and the critical temperature of the superconductor, resulting in a limited choice of materials from which the support materials could be formed.

The multi filament superconducting wires according to the present invention can be fabricated using standard extrusion and wire drawing procedures known in the art (e.g. see DeMoranville et al., "Development of a High $J_c$ Bronze Root $Nb_3Sn$ Conductor Using Nb—Ta Composite Filament". ADV. In Cryo Eng., 40A, 931—931, 1994 and Suenaga). Typically, in the referenced procedures multi filament billets are assembled from monofilaments. The billets are conventionally extruded into rods. This extruded stock can then be drawn into wire of the desired shape and size. According to the present inventive method, the unreacted wire can then be reacted to form a superconducting phase by further heat treatment (for example, about 900–950 K for about 100 hrs) and then spun into cable, or alternatively, the unreacted wire can first be spun into cable before reacting by heat treatment. Cabling of the wires can be accomplished by standard cable spinning techniques known in the art. Cabling of reacted wire stock according to the invention will result in a cable that has a relatively low degree of inter-wire bonding. For cables that are spun from unreacted wire and subsequently reacted to form superconducting filaments, the degree of inter-wire bonding in the reacted cables can be controlled and reduced by surface-treating the wire that comprises the cable before it is reacted. "Surface treatment" as used herein refers to any coating or modification of the external surface of wires that tends to reduce the degree of inter-wire bonding in a cable spun from the wires. Preferably, the surface treatment is performed on the unreacted wire stock before the cable spinning process. In one embodiment, the wire is coated with a synthetic oil, such as ordinary motor oil, in a batch process by soaking the wire in the oil. Alternatively, the wire could be coated continuously by passing the wire continuously through the oil. In another embodiment, the wire is coated in a similar fashion with graphite dag. In another embodiment, the wire is surface-treated by chemical oxidation with suitable chemical oxidants known in the art. Chemical oxidation can also be performed in a batch or continuous process. In one preferred embodiment, the wire is surface-treated by application of thermally applied oxides. In one embodiment, thermally applied oxides are applied to the wire by heat treating each wire in an in-line operation where a wire is paid off its spool and into and through a furnace onto a take-up spool. The wire undergoing surface treatment according to this embodiment undergoes thermally-induced surface oxidation in the oven where it is exposed to heated air. In one preferred method the wire is exposed to heated air at about 450 degrees Celsius for about 10–20 seconds. Alternatively the wire can be surface treated before reaction but after cabling and before winding of the cable into a coil. In general, to achieve a target inter-strand conductivity, the coating layer thickness on the wires can be adjusted. For example, an oxide layer thickness can be decreased by a subsequent heat treatment in a reducing atmosphere, such as hydrogen. The current invention is not limited to the fabrication methods discussed herein. It is to be understood that the articles of the invention may be fabricated by any suitable technique.

In certain embodiments, for example, the embodiment shown in FIG. 6, the superconducting cables of the present invention can include wires that do not have filaments formed from superconductors 106 in addition to wires that include filaments formed of superconductors 102. Instead, these wires may be formed from materials that are designed to provide mechanical support to the cable and/or enhance thermal or current flow stability of the cable. Since the "react-then-wind" method can be used when forming the cables of the present invention, wires used for mechanical support and/or to enhance thermal stability need not be compatible with the reaction temperature of the superconductor. Such materials and wires appropriate for use in the present invention are known to those skilled in the art. In addition, the superconducting cables according to the present invention can be electrically insulated before being wound into a coil, for example, in fabricating a superconducting magnet.

In related art systems formed by the "wind-then-react" method, joint terminations can become permanent fixtures after heat treatment. Usually, these fixtures cannot be subsequently repaired or altered. However, according to the present invention, the use of flexible, reacted superconducting cables allows joint fabrication to be performed with the possibility of subsequent repair or reassembly.

The function and advantage of these and other embodiments of the present invention will be more fully understood from the examples below. The following examples are intended to illustrate the benefits of the present invention, but do not exemplify the full scope of the invention.

EXAMPLE 1

Fabrication of Multi-Filamentary Wire Stock

The technique used for fabrication of multi-filamentary wire stock from Niobium and bronze was similar to that described by DeMoranville et al., "Development of a High $J_c$ Bronze Root $Nb_3Sn$ Conductor Using Nb—Ta Composite Filament". ADV. In Cryo Eng., 40A, 931—931, 1994.

Two multi-filament billets were assembled from 1.1 mm hex shaped monofilaments. The billets were conventionally extruded to 16 mm diameter rods after a pre-heat of 30 minutes at about 850 K. The extruded stock was drawn by conventional methods to 0.30 mm diameter wire with no problems. Processing of all stock beyond 0.30 mm diameter was not necessary, and only a portion was drawn to 0.13 mm diameter, which proceeded without difficulties.

EXAMPLE 2

Cabling of Reacted Wires

About 300 m of unreacted Nb—Sn wire at 0.13 mm diameter was reacted on a 100 mm diameter stainless steel spool. The heat treatment was at 950 K for 100 hours. After the heat treatment, the reacted wire stock was transferred onto six, 100 mm diameter spools. The spools were used to fabricate a 6 around 1 strand configuration with the central strand being a pure Cu wire. The cabling was done with a twist pitch of 25 mm. A continuous 30 m cable was fabricated. The resulting product was a flexible cable whose superconducting properties as a function of bending radius of curvature were similar to the strands of individual superconducting wire included in the cable.

EXAMPLE 3

Cabling of Wires Then Reacting

In order to reduce inter-wire bonding (1) synthetic oil, (2) graphite dag, (3) chemically applied oxides, or (4) thermally applied oxides were applied to the strands of example 1. Several 3, 7, and 21-strand flexible cables were produced. After the aforementioned surface treatment, the cable samples were heat treated in a He atmosphere at 925–950 K for 100–200 hours, either straight or wound around 45–100 mm diameter stainless steel forms. The resulting product was a flexible cable whose superconducting properties as a function of bending radius of curvature were similar to the strands of individual superconducting wire included in the cable.

EXAMPLE 4

Flexibility Testing

Flexibility of a single strand and in a 21-strand cable (reacted after cabling and including a chemically applied oxide surface treatment on the wires) were examined and compared after a reaction heat treatment. To examine the flexibility of the cables, both the reacted single strand and the 21 strand cable were subjected to a bending test to determine the radius of curvature required to fracture the reacted wires. To provide a baseline for comparison, the single strand was bent around a series of steel cylinders (sizing plugs) with decreasing diameters, until the wire fractured. The sample was reacted on a 47 mm diameter spool. The single 0.13 mm diameter strand was bent around a series of steel sizing plugs and subsequently fractured at a plug radius of 3.175 mm. The wire was successfully bent around a 3.3 mm radius plug without fracturing the wire. Bending the 21 strand cable around steel plugs until any one of the strands fracture was used as the criterion for flexibility. If the strands in the cable behaved independently, the 0.64 mm cable should be as flexible as the individual 0.13 mm strands it is made from. The reacted cable was successfully bent to 3.175 mm radius with no broken strands. Subsequent bending to 3.05 mm radius produced several broken strands in the cable. This successfully demonstrates the flexibility of the reacted cable.

In another flexibility test a 54-strand cable made by cabling of reacted wires was bent around a 15 mm diameter form with no broken strands. For a solid wire with the diameter equal to the overall diameter of the cable, the bend would produce a strain of about 10%, which is larger than $Nb_3Sn$ can withstand without fracturing.

EXAMPLE 5

Critical Current Density

To establish some baseline critical current density ($J_c$) data, a straight section of the 0.13 mm diameter stock wire together with samples of wire that were wound on to stainless steel spools with diameters of 75, 100, 140, 180 mm were reacted by heat treatment. The heat treatments used in this project for wires and cables were at 925–950 K for 100–150 hours. These were not designed to optimize the critical currents but to provide representative critical current density values.

Figure 7:
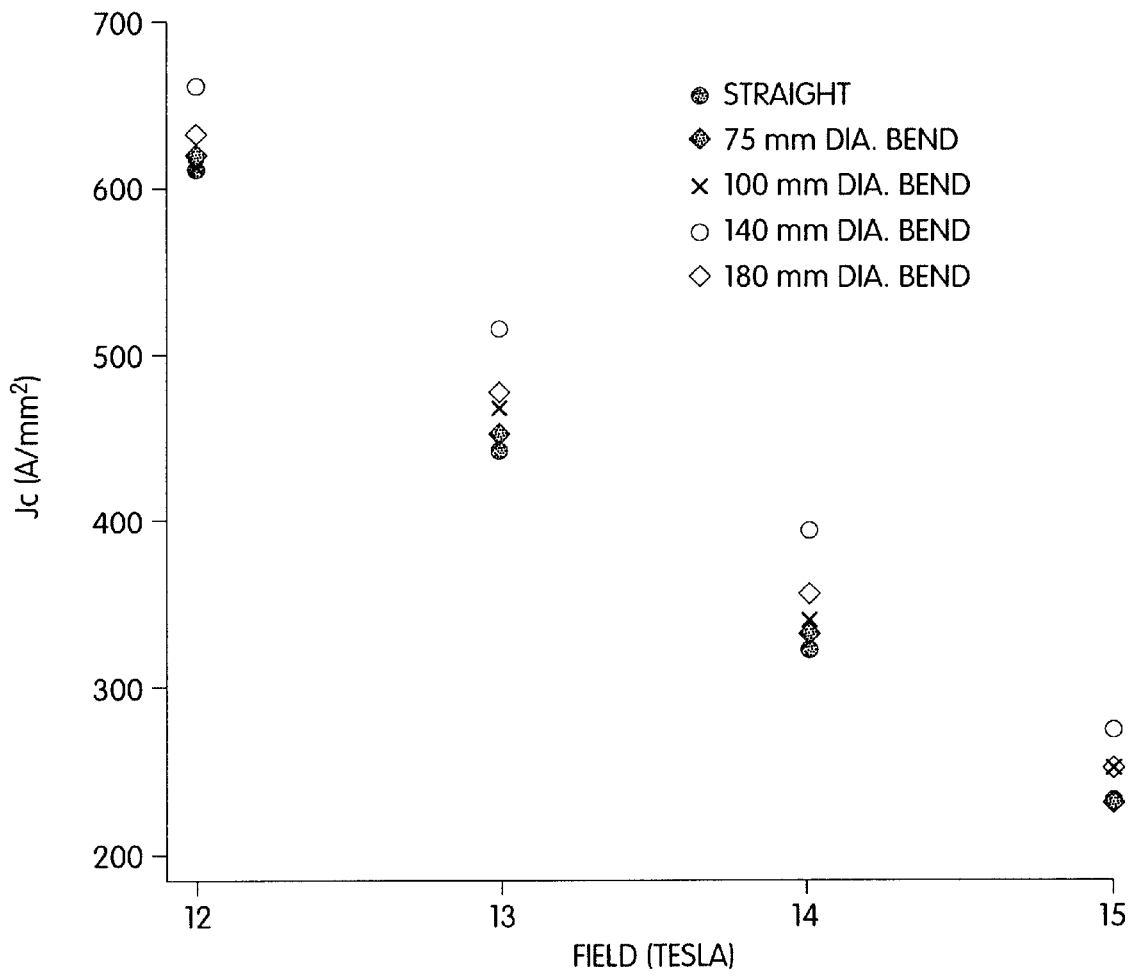
FIG. 7 is a graph demonstrating the critical current density as a function of magnetic field strength for certain embodiments of the present invention.

Spooled wire samples were straightened after the heat treatment and tested for Jc using the four point method well known in the art in background fields of up to 15 Tesla in liquid He. The maximum strain experienced by the wires after straightening was calculated to be 0.15, 0.11, 0.08, 0.06% for spool diameters of 75, 100, 140, 180 mm respectively. Jc results are shown in FIG. 7, the critical current criterion used was 1 $\mu v/cm$. There is no degradation of Jc with strain. In fact strain improved the Jc. Strain produced by bending a sample around a diameter produces tension on the filaments located above the natural axis of the wire and compression for the filaments below (reverse being true for unbending). Therefore, improvement in the Jc with bending is not of the same nature as that observed for wires under pure tension. The improvement is most likely due to a mechanism of relaxation of precompression of the $Nb_3Sn$ filaments.

The combined effect of cabling and bending on 7-strand cables was also examined. As previously discussed, flexible reacted cables were fabricated using two distinct approaches; 1)Cabling of Reacted Wires (CRW), and 2) specially coated unreacted wires that were Reacted After Cabling (RAC).

Figure 8:
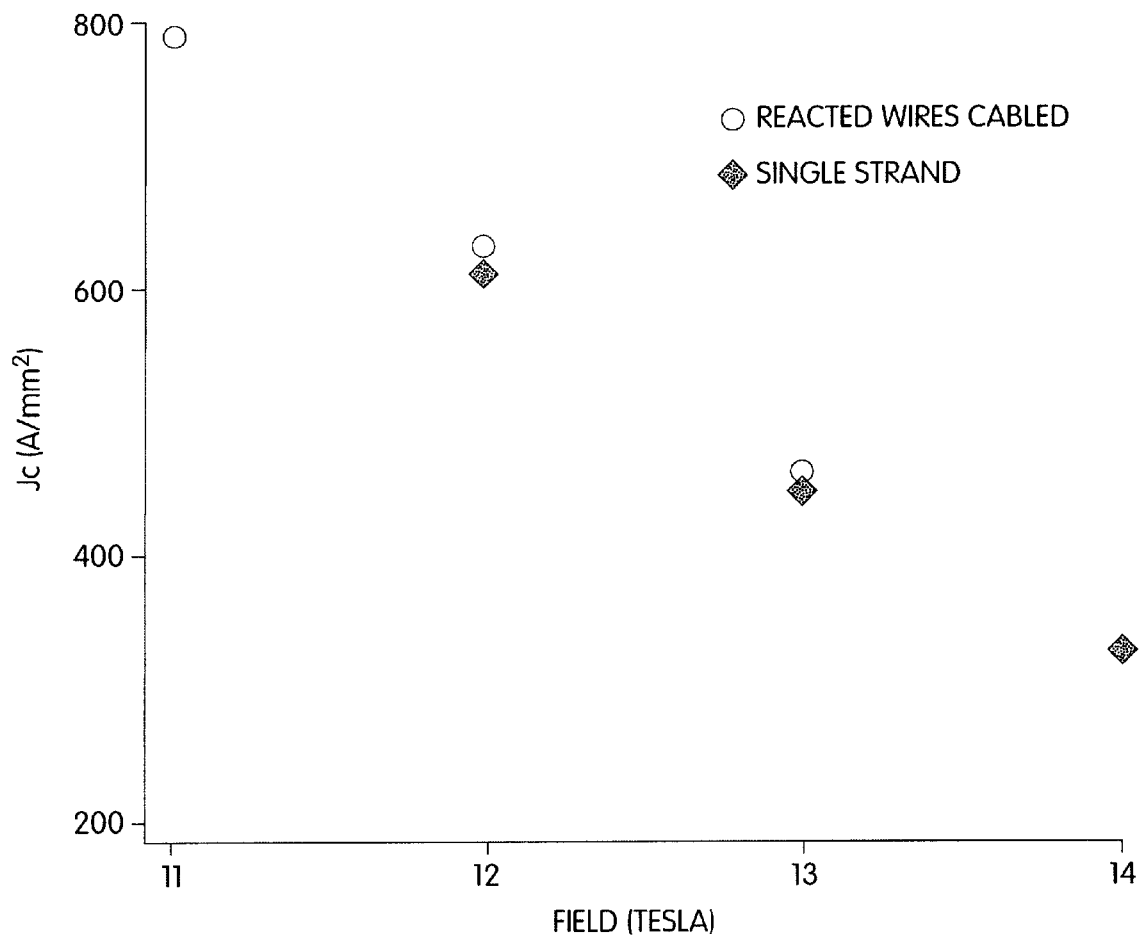
FIG. 8 is a graph demonstrating the critical current density as a function of magnetic field strength for certain embodiments of the present invention.
Figure 9:
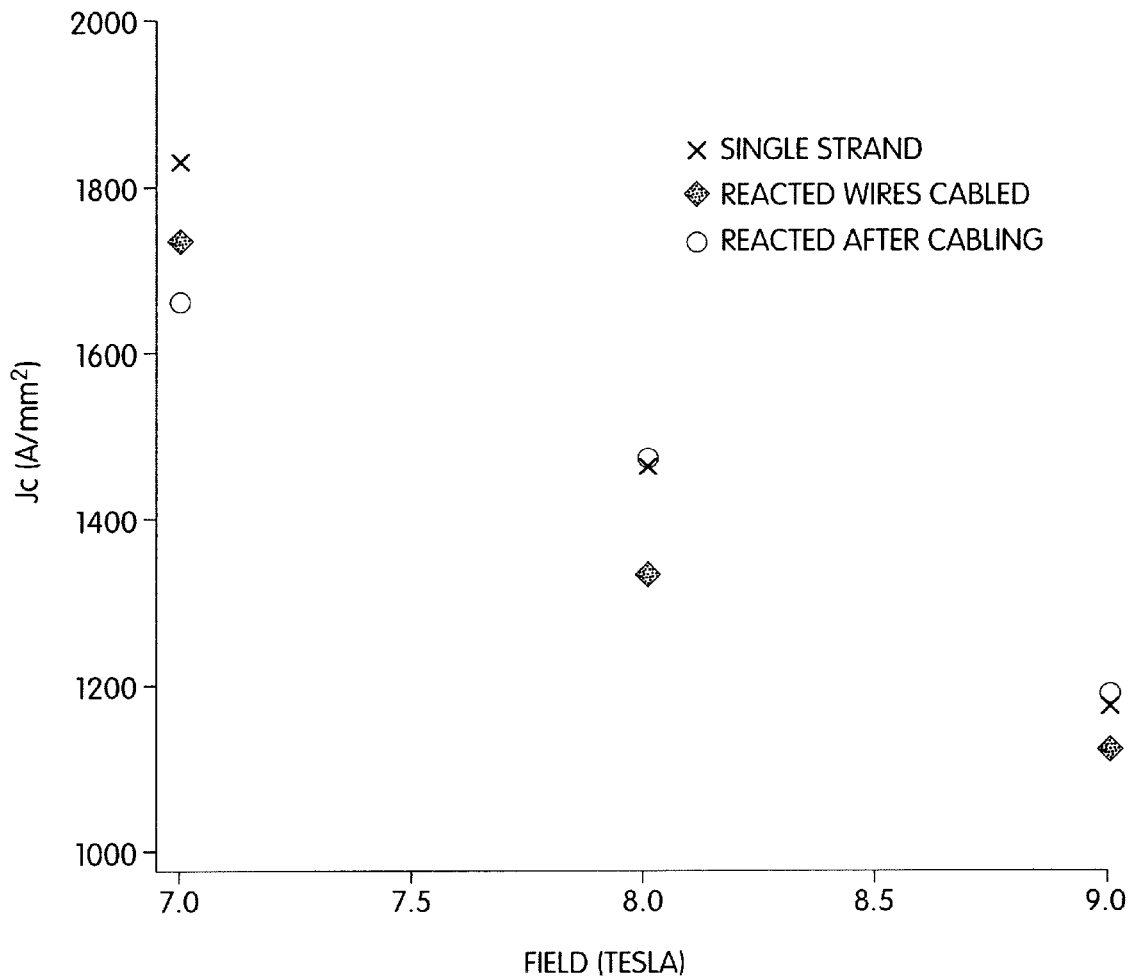
FIG. 9 is a graph demonstrating the critical current density as a function of magnetic field strength for certain embodiments of the present invention.

FIG. 8 shows the Jc versus magnetic field for the 7-strand CRW compared to a baseline, single-strand wire that was reacted and tested with no applied strain. The stocks for the 7-strand RAC sample were wound on 100 mm diameter stainless steel spools and reacted. After reaction, the RAC samples were straightened prior to testing. The RAC cables and a section of the CRW cable were tested in background fields of up to 9 Tesla. Typical results are given in FIG. 9. All experiments and measurements indicated that mechanical operations can be undertaken without significant damage to reacted $Nb_3Sn$ wires and cables.

EXAMPLE 6

Insulted Superconducting Cable

Figure 10:
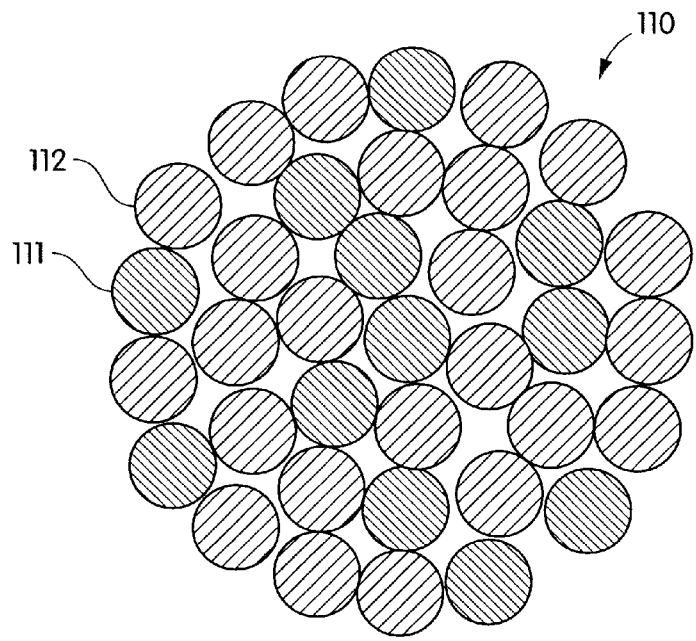
FIG. 10 is a cross-sectional view of a superconducting cable according to one embodiment of the present invention.
Figure 11:
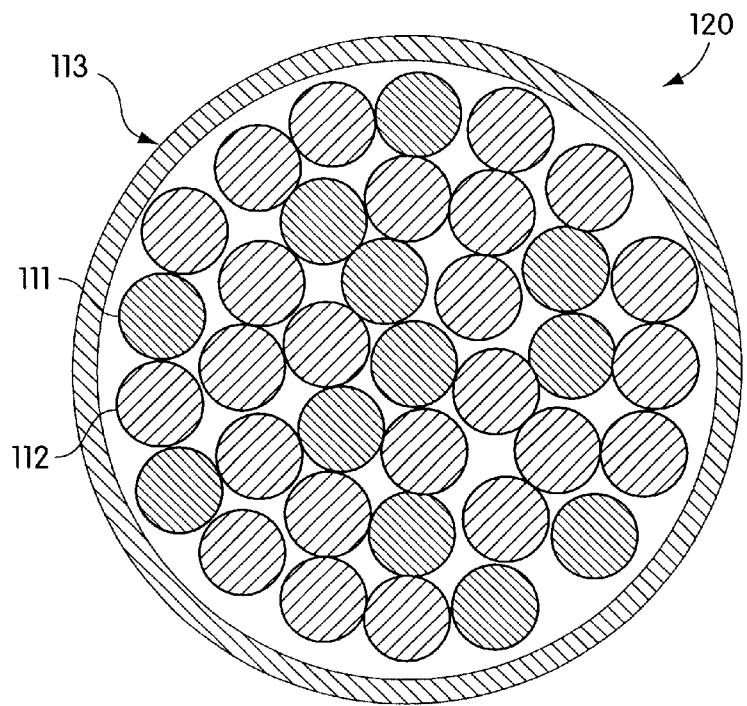
FIG. 11 is is a cross-sectional view of an insulated superconducting cable according to one embodiment of the present invention.
Figure 12:
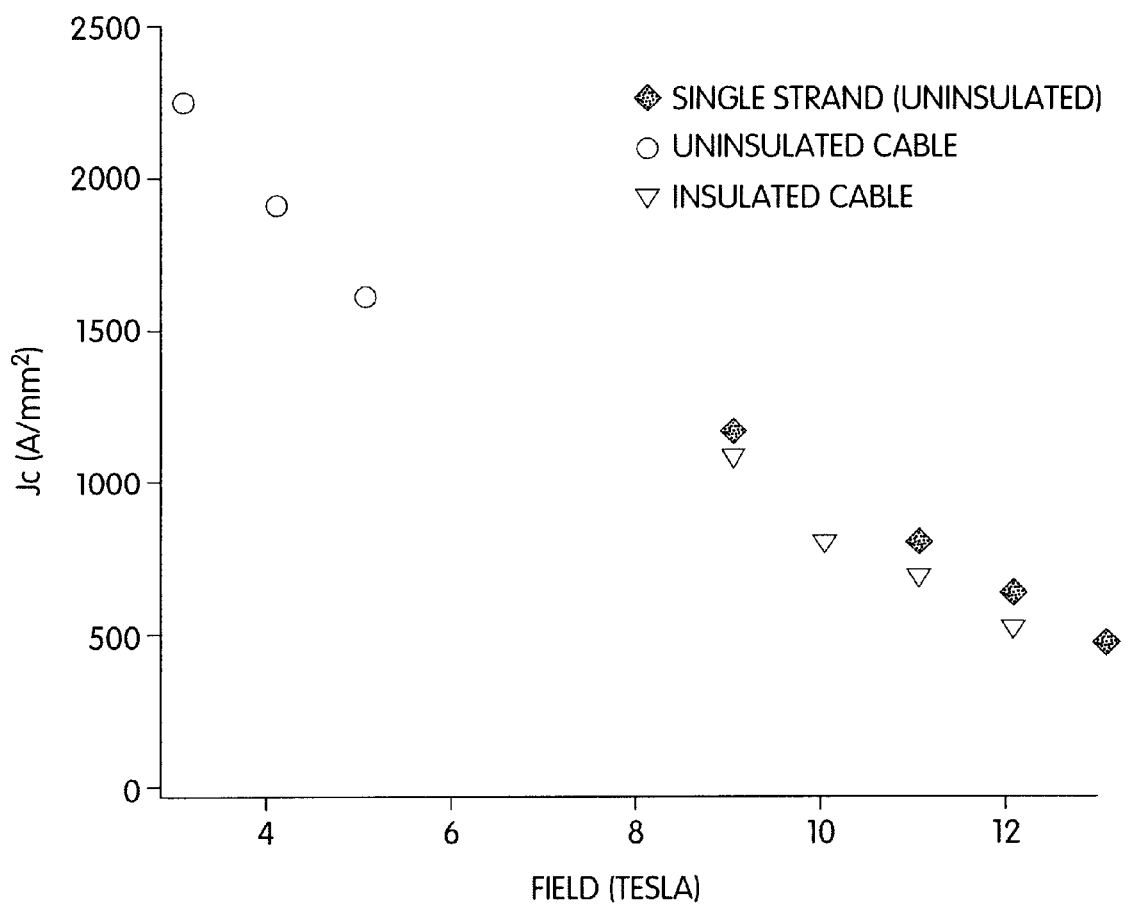
FIG. 12 is a graph demonstrating the critical current density as a function of magnetic field for certain embodiments of the present invention.

Two samples of flexible superconducting RAC cable were prepared according to the methods described in Examples 1, 3 and 5 using a thermally applied oxide as a surface treatment. The sample cables, (FIG. 10) were fabricated to include 12 $Nb_3$ Sn superconducting wires at 0.13 mm diameter 111 and 24 pure copper wires at 0.13 mm diameter 112. One of the test samples (FIG. 11) was insulated with S-glass braid insulation 113 according to a conventional wire-coating technique before testing. The insulation procedure included a number of winding and unwinding steps where the cable was wound onto a spool about 10 cm in diameter (a radius of curvature smaller than that for some superconducting magnet applications). The two cable samples 110 and 120, along with a single superconducting wire strand that was reacted and tested with no applied strain, were tested at 4.2 K for Jc using the four point method in background fields up to 13 Tesla. Typical results are shown in FIG. 12. The test results were substantially similar for all of the tested samples indicating that the cabling and insulation procedures did not have a significant effect on the current-carrying capacity of the conductors.

Having thus described certain embodiments of the present invention, various alterations, modifications and improvements will be obvious to those of ordinary skill in the art. Such alterations, modifications and improvements are intended to be within the scope of the present invention. Accordingly, the above description is meant by way of example only and is not intended to be limiting. The present invention is limited only by the claims listed below and equivalents thereto.

What is claimed is:

1. A method of making a superconducting cable comprising:
   providing a plurality of wires at least one of which has at least one filament formed of a brittle superconductor; and
   intertwining the plurality of wires so that more than 50% of intimate contact surface areas between the wires are free of inter-wire bonds.

2. The method according to claim 1, wherein a cable is formed during the intertwining step and wherein the strain on the wires within the cable due to bending of the cable is essentially independent of a cross-sectional radius of the cable.

3. The method according to claim 1, wherein the at least one wire of said plurality of wires that has at least one filament formed of a brittle superconductor undergoes a degradation in critical current density of at least 10% beyond an axial strain of about 2% and has a maximum cross-sectional dimension of 0.5 mm.

4. The method according to claim 3, wherein a cable is formed during the intertwining step and wherein essentially all of the wires of the cable are transposed.

5. A method of making a superconducting cable comprising:

providing a plurality of wires;

intertwining the plurality of wires to form a cable; and reacting the plurality of wires to form at least one superconducting filament under conditions selected to produce a plurality of inter-wire bonds resulting in a predetermined degree of interwire bonding while leaving more than 50% of intimate contact surface areas between the wires free of inter-wire bonds.

6. The method according to claim 5 wherein at least one of the plurality of wires is surface treated.

7. The method according to claim 6 wherein the surface treatment comprises coating with a synthetic oil.

8. The method according to claim 6 wherein the surface treatment comprises coating with graphite dag.

9. The method according to claim 6 wherein the surface treatment comprises chemical oxidation.

10. The method according to claim 6 wherein the surface treatment comprises thermal oxidation.

11. The method according to claim 5, wherein a strain on the wire within the cable, after the reacting step, is essentially independent of a cross-sectional radius of the cable.

12. The method according to claim 5, wherein the plurality of wires is intertwined in the intertwining step so that essentially all of the wires of the cable are transposed.

13. The method according to claim 12, wherein in the reacting step, the plurality of wires is reacted to form at least one filament comprised of a brittle superconductor in at least one wire, resulting in at least one wire of said plurality of wires that has at least one filament formed of a brittle superconductor that undergoes a degradation in critical current density of at least 10% beyond an axial strain of about 2% and has a maximum cross-sectional dimension of 0.5 mm.

14. A method of making a superconducting cable comprising:

providing a plurality of wires at least one of which has at least one filament formed of a brittle superconductor; and intertwining the plurality of wires to form a cable so that a strain on the wires within the cable due to bending of the cable is essentially independent of a cross-sectional radius of the cable.

15. The method according to claim 14, wherein the at least one wire of said plurality of wires that has at least one filament formed of a brittle superconductor undergoes a degradation in critical current density of at least 10% beyond an axial strain of about 2% and has a maximum cross-sectional dimension of 0.5 mm.

16. The method according to claim 15, wherein a cable is formed during the intertwining step and wherein essentially all of the wires of the cable are transposed.

* * * * *

UNITED STATES PATENT AND TRADEMARK OFFICE
CERTIFICATE OF CORRECTION

PATENT NO.     : 6,510,604 B1
DATED          : January 28, 2003
INVENTOR(S)    : Shahin Pourrahimi It is certified that error appears in the above-identified patent and that said Letters Patent is hereby corrected as shown below:

<u>Title page,</u>
Item [56], OTHER PUBLICATIONS, please add -- R.M. Scanlan and W.A. Fietz, "Multifilamentary $Nb_3Sn$ for Superconducting Generator Applications", IEEE Transactions on Magnetics, Vol. MAG-11, No. 2, pp 287-290, March 1975 --

Signed and Sealed this

Fifteenth Day of July, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,510,604 B1
DATED : January 28, 2003
INVENTOR(S) : Shahin Pourrahimi It is certified that error appears in the above-identified patent and that said Letters Patent is hereby corrected as shown below:

<u>Title page,</u>
Item [57], ABSTRACT,
Lines 8 and 9, "react-then-wind" should read -- wind-then-react --.

<u>Column 2,</u>
Line 13, "can not" should read -- cannot --.

<u>Column 3,</u>
Line 39, "can not" should read -- cannot --.

<u>Column 6,</u>
Line 59, "can not" should read -- cannot --.

<u>Column 9,</u>
Line 21, "achievable prior" should read -- achievable by prior --.
Lines 36-37, delete "to the center of the bore" at the end of the sentence right before the period.
Line 41, delete "to the center of curvature" at the end of the sentence right before the period.
Line 46, "cable" should read -- cables --.
Line 62, "which the at least" should read -- which at least --.

<u>Column 16,</u>
Line 25, "$Nb_3$ Sn" should read -- $Nb_3Sn$ --.

Signed and Sealed this

Twenty-sixth Day of August, 2003

JAMES E. ROGAN
*Director of the United States Patent and Trademark Office*